United States Patent
Dedic

(12) United States Patent (10) Patent No.: US 6,317,305 B1
Dedic (45) Date of Patent: Nov. 13, 2001

(54) ELECTROSTATIC DISCHARGE PROTECTION IN SEMICONDUCTOR DEVICES WITH REDUCED PARASITIC CAPACITANCE

(75) Inventor: Ian Juso Dedic, Northolt (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/227,254

(22) Filed: Jan. 8, 1999

(30) Foreign Application Priority Data

Mar. 4, 1998 (GB) .................................................. 9804588

(51) Int. Cl.$^7$ .................................................... H02H 9/00
(52) U.S. Cl. .............................. 361/56; 361/111; 257/386
(58) Field of Search ................................ 361/54, 56, 111, 361/91.1, 915; 257/355, 356, 360, 367, 372, 386; 327/310, 309

(56) References Cited

U.S. PATENT DOCUMENTS

| | | | | |
|---|---|---|---|---|
| 4,605,980 | * | 8/1986 | Hartranft et al. ....................... | 361/56 |
| 5,576,557 | * | 11/1996 | Ker et al. .............................. | 257/173 |
| 5,610,426 | | 3/1997 | Asai et al. . | |
| 5,637,900 | * | 6/1997 | Ker et al. .............................. | 257/355 |
| 5,679,971 | | 10/1997 | Tamba et al. ........................ | 257/357 |
| 5,683,918 | | 11/1997 | Smith et al. ............................. | 437/21 |
| 5,701,024 | * | 12/1997 | Watt ..................................... | 257/360 |
| 5,714,785 | | 2/1998 | Jiang ..................................... | 257/360 |

FOREIGN PATENT DOCUMENTS 6-53497   2/1994   (JP) .

OTHER PUBLICATIONS

U.S. application No. 09/137,837, Schofield et al., filed Aug. 21, 1998.
U.S. application No. 09/227,201, Dedic., filed Jan. 8, 1999.
U.S. application No. 09/227,202, Dedic., filed Jan. 8, 1999.
U.S. application No. 09/227,200, Schofield., Jan. 8, 1999.
Say, Q. "Resistorless ESD Protection Device for High Speed CMOS Circuits", Proceedings of the Custom Integrated Circuits Conference, US, New York, IEEE, vol. CONF. 10, May 16, 1988, pp. 2721–2724.

* cited by examiner

Primary Examiner—Michael J. Sherry
Assistant Examiner—Kim Huynh
(74) Attorney, Agent, or Firm—Staas & Halsey LLP

(57) ABSTRACT

A semiconductor device which protects external circuitry from electrostatic discharges. The device has is connected to one or more power supply lines and to external circuitry through a connection terminal. A ground terminal may be considered as one of the power lines. Electrostatic discharge protection is provided by a field effect transistor having a source region and gate connected to the connection terminal and a drain region connected to one of the power supply lines. For an arrangement for a suppressing voltages which exceed the potential of a positive power supply line, the transistor turns ON when the connection terminal potential becomes about 1 volt above the power supply potential. For an arrangement for suppressing voltages which fall below a negative power supply potential, the transistor turns ON when the connection terminal potential falls about 1 volt below the power supply potential. Otherwise the transistor is OFF. In one embodiment, a source region of a P-type transistor is surrounded by region of semiconductor material of the opposite conductivity type (N-type) and the N-type region is maintained at a potential such that a source diode, effectively formed between the source region and its surrounding region when the device is in use is reverse-biased. The arrangement reduces parasitic capacitance normally associated with protection transistors.

45 Claims, 7 Drawing Sheets

ELECTROSTATIC DISCHARGE PROTECTION IN SEMICONDUCTOR DEVICES WITH REDUCED PARASITIC CAPACITANCE

CROSS REFERENCE TO RELATED APPLICATIONS

The subject application is related to the following U.S. and respective foreign priority applications:
DIFFERENTIAL SWITCHING CIRCUITRY filed concurrently and claiming priority from Great Britain application No. 9800387.4 filed Jan. 8, 1998 assigned to Fujitsu Microelectronics Limited;
THERMOMETER CODING CIRCUITRY filed concurrently and claiming priority from Great Britain application No. 9800384.1 filed Jan. 8, 1998 assigned to Fujitsu Microelectronics Limited;
MIXED-SIGNAL CIRCUITRY AND INTEGRATED CIRCUIT DEVICES filed concurrently and claiming priority from Great Britain application No. 9804587.5 filed Mar. 4, 1998 assigned to Fujitsu Limited; and
CELL ARRAY CIRCUITRY, U.S. Ser. No. 09/137,837 filed Aug. 21, 1998 and claiming priority from Great Britain application No. 9800367.6 filed Jan. 8, 1998 assigned to Fujitsu Limited.

BACKGROUND OF THE INVENTION

1. Field of the Invention

The present invention relates to electrostatic discharge (ESD) protection in semiconductor devices, in particular in semiconductor devices in which an input or output signal of the device is permitted to vary within a predetermined range of potentials including a potential equal or close to the potential of one of the power supply lines of the device.

2. Description of the Related Art

FIG. 1 of the accompanying drawings shows parts of a conventional semiconductor device having ESD protection. An output circuit 2 of the device generates an output signal $V_O$, which is output from the device at an output terminal 3 thereof. The output voltage is permitted to vary within a range from 0 to +1 volts (relative to electrical ground GND) when the device is in use.

To protect the device 1 from damage caused by electrostatic discharges, for example due to accidental touching of the output terminal 3 by an assembly worker during assembly of the device onto a printed circuit board, the device is provided with ESD protection circuitry comprising respective first and second metal-oxide-semiconductor (MOS) field-effect-transistors (FETs) 4 and 5. The first MOS transistor 4 is of the P-type conductivity and has its gate and its source region connected to a positive power supply line VDD of the device and its drain region connected to the output terminal 3.

The second MOS transistor 5 is of the N-type conductivity and has its drain region connected to the output terminal 3 and its gate and its source region connected to a negative supply line of the device (electrical ground GND).

When the device is in use, for example when it is assembled on a circuit board and powered up, both the first and second MOS transistors 4 and 5 are turned OFF so as not to affect the circuit operation. If, however, the potential of the output terminal becomes sufficiently positive with respect to the positive supply line VDD, the transistor 4 turns ON and conducts current safely from the output terminal 3 to the positive supply line VDD, thereby preventing damage to the internal circuitry of the device such as the output circuit 2. Similarly, if the output-terminal potential becomes sufficiently negative with respect to electrical ground, the second MOS transistor 5 turns ON, so as to safely conduct current from the GND line to the output terminal 3.

As shown schematically in FIG. 1, although each of the transistors 4 and 5 for ESD protection is normally OFF during operation of the device, each transistor 4 and 5 can be regarded as having respective diodes associated with its source and drain regions. In the case of the PMOS transistor 4, there is a "source diode" $D_{SP}$ effectively connected between the source region and VDD and a "drain diode" $D_{DP}$ effectively connected between the drain region and VDD.

In the case of the NMOS transistor 5, there are respective source and drain diodes $D_{SN}$ and $D_{DN}$, effectively connected between the relevant source or drain region and GND.

All of the diodes $D_{DP}$, $D_{SP}$, $D_{DN}$ and $D_{SN}$ are normally non-conducting, since none of them is forward biased so long as the output-terminal potential $V_O$ remains within its permitted range of from 0 to +1 volts. However, two problems arise in the FIG. 1 device from the presence of the NMOS transistor 5. Firstly, the drain diode $D_{DN}$ provided by the NMOS transistor 5 may become sufficiently forward biased if the output-terminal potential $V_O$ goes below 0 volts. The NMOS transistor 5 therefore has the effect of limiting the permitted range of output voltages of the output circuit 2, which in certain applications (for example digital-to-analog converters having current outputs) may be undesirable.

Secondly, the drain diode $D_{DN}$ provided by the NMOS transistor 5, although turned OFF, has a parasitic capacitance associated with it and this capacitance is both relatively large and highly non-linear when the output-terminal potential is within the permitted range close to GND. By way of illustration, a curve N in FIG. 2 shows the variation of the parasitic capacitance associated with the NMOS transistor 5 with the output-terminal potential $V_O$. In FIG. 2, VDD is 3V, by way of example. When the output-terminal voltage $V_O$ is within the range of from 0 to +1 volts, it can be seen from FIG. 2 that the effect of the parasitic capacitance associated with the N MOS transistor 5 can be highly significant.

Incidentally, for comparison purposes, the corresponding parasitic capacitance associated with the PMOS transistor 4 is indicated by a curve P. The parasitic capacitance associated with the PMOS transistor 4 is relatively low and, moreover, relatively linear. Such linearity makes it possible to compensate for the parasitic capacitance of the PMOS transistor, if desired. No such compensation is possible, however, for the much larger parasitic capacitance associated with the NMOS transistor 5, in view of the non-linearity thereof.

It is therefore desirable to provide ESD protection for a semiconductor device which does not impose restrictions of the kind mentioned above on the permitted range of input/output voltages of the device and also avoids the problems associated with parasitic capacitances of the ESD protection circuitry.

SUMMARY OF THE INVENTION

The present invention provides internal circuitry of a semiconductor device with protection from electrostatic discharges. A connection terminal is provided for connecting the internal circuitry of the device to an external circuit. In use, the connection terminal potential is permitted to vary within a predetermined range of potentials including a potential equal or close to the potential of a power supply line of the device.

In a first embodiment, the electrostatic discharge protection is provided by a field-effect transistor having a source region connected to the connection terminal, a gate connected so as to be equal or close in potential to the source region, and a drain region connected to a discharge path whose potential with respect to a negative power supply is such that the transistor turns ON when the connection terminal potential falls below a predetermined protection potential. Otherwise the transistor is OFF.

In a second embodiment, the electrostatic discharge protection is provided by a field-effect transistor having a source region connected to the connection terminal, a gate connected so as to be equal or close in potential to the source region, and a drain region connected to a discharge path whose potential with respect to a positive power supply is such that the transistor turns ON when the connection terminal potential rises above a predetermined protection potential. Otherwise the transistor is OFF.

In the first embodiment, a source region of a P-type transistor is surrounded by region of semiconductor material of the opposite conductivity type (N-type) and the N-type region is maintained at a potential such that a source diode, effectively formed between the source region and its surrounding region is reverse-biased when the device is in use.

In the second embodiment, a source region of a N-type transistor is surrounded by region of semiconductor material of the opposite conductivity type (P-type) and the P-type region is maintained at a potential such that a source diode, effectively formed between the source region and its surrounding region is reverse-biased when the device is in use.

The arrangements of both embodiments reduce parasitic capacitance associated with electrostatic discharge protection.

DESCRIPTION OF THE PREFERRED EMBODIMENTS

Figure 1:
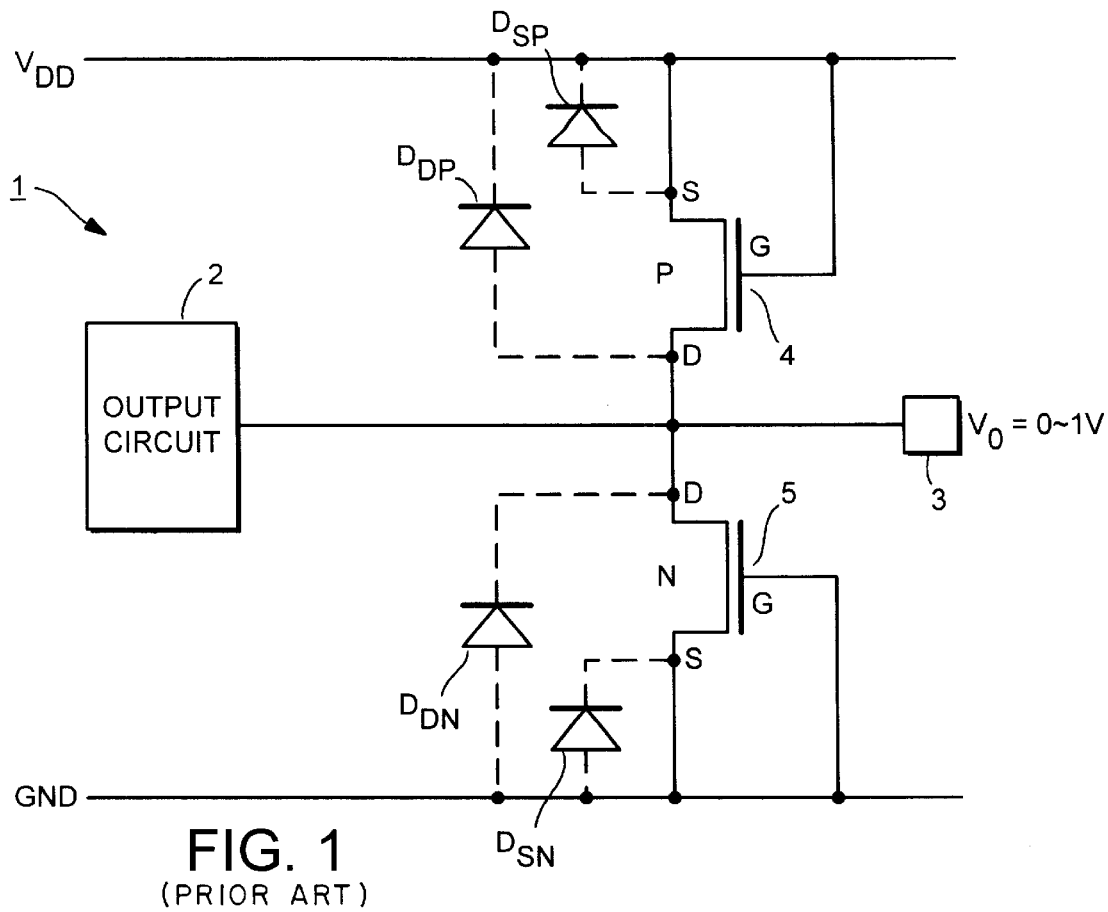
FIG. 1, discussed hereinbefore, shows a circuit diagram of parts of a conventional semiconductor device having ESD protection.
Figure 2:
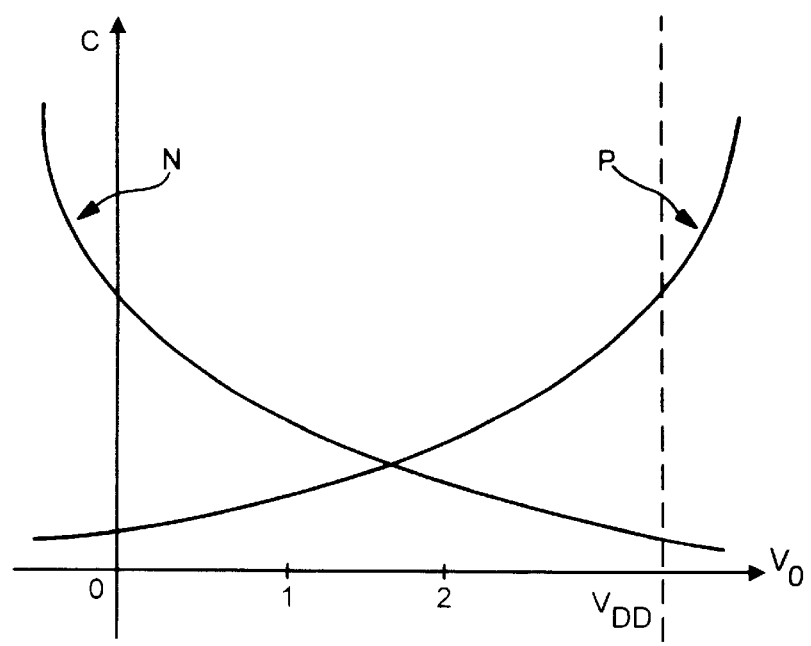
FIG. 2, also discussed hereinbefore, presents a graph for illustrating the effects of parasitic capacitances in the ESD protection circuitry of the FIG. 1 device.
Figure 3A:
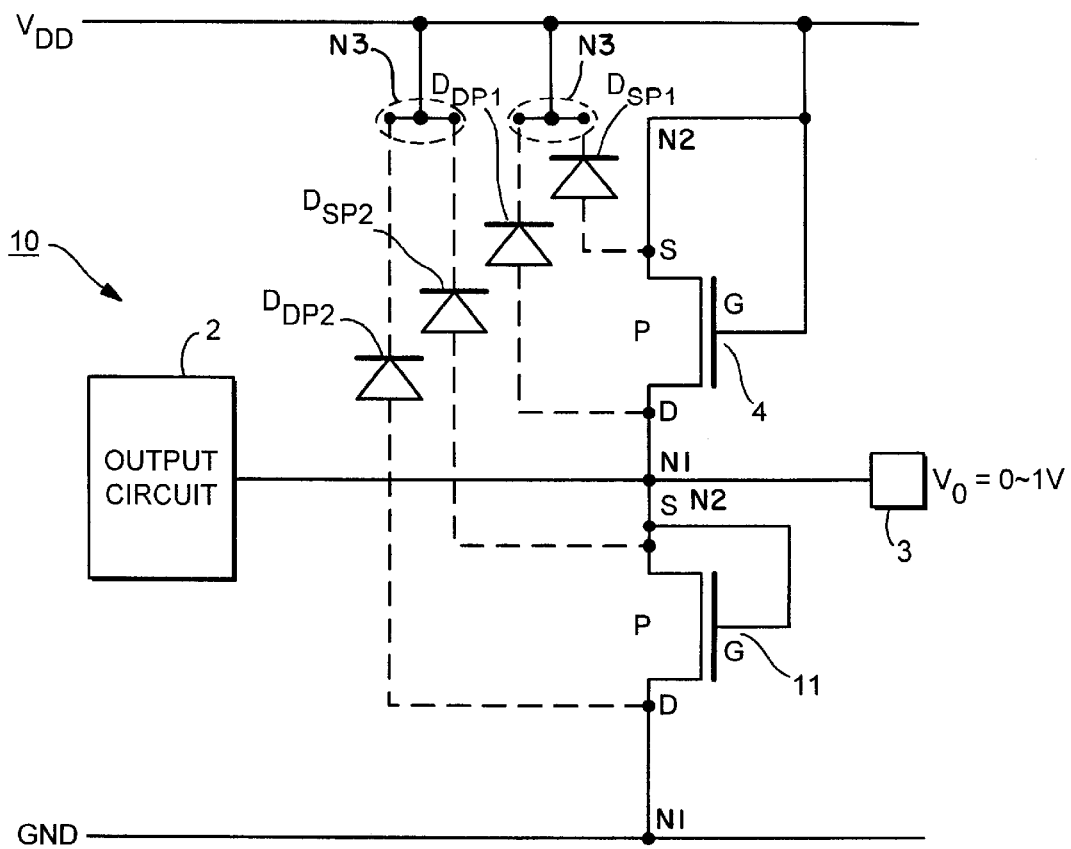
FIG. 3A shows a first circuit diagram of parts of a semiconductor device having P-type ESD protection embodying the present invention.

In FIG. 3A, components which are the same as components of the FIG. 1 semiconductor device described hereinbefore are denoted by the same reference numerals as were used in FIG. 1 and these components will not be described further here. Incidentally, for the sake of clarity in the following description, the respective source and drain diodes of the PMOS transistor 4 are denoted in FIG. 3A by the reference numerals $D_{SP1}$ and $D_{DP1}$.

The FIG. 3 device differs from the FIG. 1 device in that the NMOS transistor 5 of the FIG. 1 device is replaced by a second PMOS transistor 11 which has its gate and its source region connected to the output terminal 3 and its drain region connected to electrical ground GND. Being a P-type conductivity transistor, the transistor 11 provides a source diode $D_{SP2}$ between its source region and VDD and a drain diode $D_{DP2}$ between its drain region and VDD.

In use of the FIG. 3A device, because the source region and gate of the PMOS transistor 11 are at equal potentials, the transistor is maintained in the OFF condition. However, should the output-terminal potential become sufficiently negative with respect to electrical ground, the transistor 11 will turn ON, safely conducting current through its channel from the ground line GND to the output terminal 3. Thus, the PMOS transistor 11 serves an equivalent function to the NMOS transistor 5 in FIG. 1 in providing an ESD protection path from the output terminal 3 to the ground line GND for use in conducting away negative spikes on the output terminal.

Figure 4:
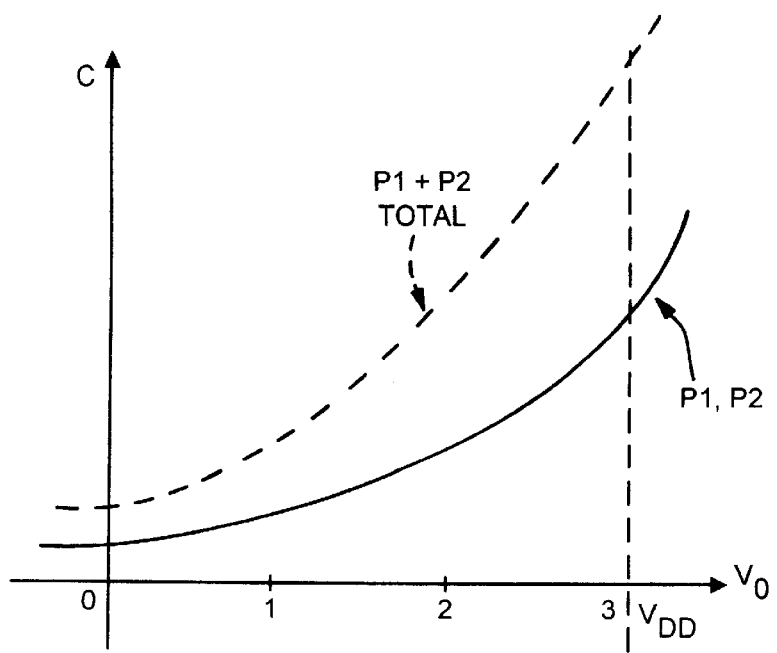
FIG. 4 shows a graph for use in illustrating the effects of parasitic capacitances associated with the ESD protection circuitry of the FIG. 3 device.

It will be seen that in the FIG. 3A device, each of the source and drain diodes $D_{SP2}$ and $D_{DP2}$ associated with the PMOS transistor 11 is strongly negatively biased (by at least two volts when VDD=+3V) when the output-terminal potential varies within the range of from 0 to +1 V. Thus, the parasitic capacitance associated with the PMOS transistor 11 is small and linear in this range (as denoted by the curve P2 in FIG. 3), as is the parasitic capacitance associated with the other PMOS transistor 4 (denoted by the curve P1 which in this example coincides with the curve P2 in FIG. 4). The sum of the parasitic capacitances of the two PMOS transistors 4 and 11 is denoted by the dotted curve marked "P1+P2 TOTAL" in FIG. 4. This total capacitance is small and linear in the desired range of output voltages of the device. Accordingly, this total parasitic capacitance can either be neglected or, in the most demanding applications, compensated for by appropriate compensation means well known to those skilled in the art.

The transistor 4 shown in FIG. 3 can be omitted entirely, if desired, since the source diode $D_{SP2}$ of the transistor 11 already provides an ESD protection path to VDD which conducts when the output-terminal potential rises a predetermined amount above VDD.

Figure 5A:
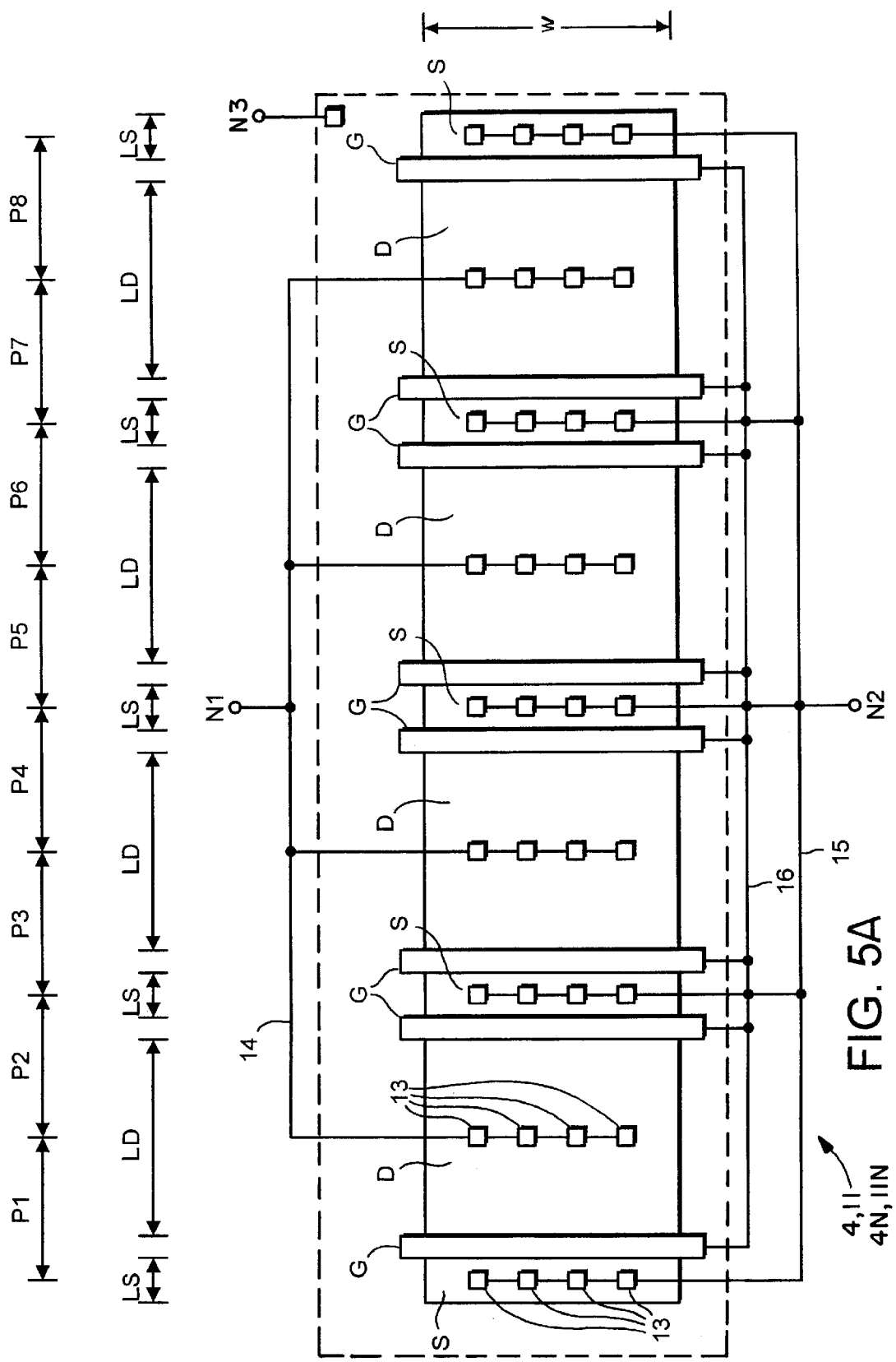
FIG. 5A shows a schematic plan view of a part of the ESD protection circuitry in the FIG. 3A and the FIG. 3C device.

FIG. 5A shows a schematic plan view of a P MOS transistor suitable for use as the transistor 4 or the transistor 11 of the FIG. 3A device. In FIG. 5A, the PMOS transistor has an interleaved configuration which is effective in reducing the physical width w of the transistor. In this interleaved configuration, each of the gate, source and drain regions of the transistor is split into a number of different portions that are arranged one after the next in the lengthwise direction and connected electrically in parallel with one another. By way of example in FIG. 5A, the transistor is shown split into eight portions P1 to P8. Each portion P1 to P8 has a gate, G a source S and drain D. Except for the respective sources of the end portions P1 and P8, the sources and drains of adjacent portions are continuous, for example the drain of the portion P1 is continuous with the drain of the adjacent portion P2 and is accordingly denoted in FIG. 5 itself by a single drain region D of length LD. Similarly, the source of the transistor portion P2 is continuous with the source of the adjacent transistor portion P3 and accordingly these two sources are shown as one continuous source region S of length LS in FIG. 5A.

Midway along each such drain or source region D or S (i.e. where the respective sources or drains of two adjacent transistor portions meet) a set of contacts 13, shared between the two portions, is provided for making electrical connections to the source or drain region S or D concerned. A similar set of contacts is provided for the source regions S at the ends of the device, which belong to the transistor portions P1 and P8.

A first connection path 14 links the contacts 13 of all the drain regions D to a first connection node N1 of the transistor. A second connection path 15 links the contact 13 of all of the source regions S to a second connection node N2 of the transistor. The node N2 is also linked by a further connection path 16 to the respective gates G of the transistor portions P1 to P8.

In the case of the transistor 4 of FIG. 3, the first node N1 is connected to the output terminal 3 of the device and the second node N2 is connected to VDD. In the case of the transistor 11, the first node N1 is connected to electrical ground GND and the second node N2 is connected to the output terminal 3.

It will be seen that in FIG. 5A, within each transistor portion P1 to P8, the gate G is much nearer to the source-region contacts than to the drain-region contacts. That is, a spacing, between the gate and contacts for the drain region is greater than a spacing between the gate and the contacts for the source region and a ratio between the gate to drain contact spacing and the gate to source contact spacing may be in the range of 5:1 to 10:1 or even in the greater range of 2:1 to 20:1; For example the drain-regions contacts may be 5 or 10 times further from the gate than the source-region contacts. A spacing between the gate and the drain region contacts is of the order of 0.5 to 1 $\mu$m. There are two reasons for this positioning of the gate. One is that when the device is in use, the source region and gate of the transistor are at equal potentials, so that the electric field density at the edge of the gate on the source-region side is negligible. However, the same is not true at the opposite edge (the edge on the drain-region side) which can have a significant electric field density. As the edges of the gate are not perfectly smooth, gate breakdown may occur where the electric field density is high. By providing a significant spacing between the drain-region contacts and the gate, the electric field densities resulting from drain-gate potential difference can be kept to sufficiently low levels that damage to the gate does not occur. Secondly, a long distance between the gate and the drain-region contacts can provide a reasonable series resistance for absorbing the energy of ESD spikes.

In FIG. 5A, exemplary dimensions for the two transistors are LS=1 $\mu$m, LD=9 $\mu$m and w=100 $\mu$m. The gate length is for example 0.5 $\mu$m. Both transistors 4 and 11 can have the same physical width w, but the two transistors will typically have different numbers of transistor portions P. These figures provide the transistors with suitably large drain regions, enabling them to provide highly effective ESD protection paths.

For example, the total drain region area of the transistor 4 is approximately 2700 $\mu m^2$ (6×100 $\mu$m (w)×4.5 $\mu$m (d/2)), whilst that of the transistor 11 is as much as 13500 $\mu m^2$ (30×100 $\mu$m (w)×4.5 $\mu$m (d/2)).

The only real constraint on the effective width of the transistor 11 is associated with the capacitance that the transistor 11 imposes on the output terminal 3 to which it is connected via the connection node N2. This capacitance is proportional to the combined area of the source regions S that are connected to the output terminal 3 via the connection node N2. These source regions are relatively short (LS=1 $\mu$m for example) so that the effective width can be made very large, for example on the order of 1000 $\mu$m or more, without increasing the area (and hence the capacitance) too significantly. Thus, desirably low parasitic capacitance can be maintained even for very high values of the effective width of the transistor 11. Incidentally, the capacitance of the drain region of the transistor 11, although quite high (due to the large drain area) is not a problem because the drain is tied to electrical ground rather than to the output terminal.

It will be appreciated that it is not essential for the transistors 4 and 11 to be constructed in the interleaved configuration described above. A single wide set of gate, source and drain regions could be used in the lengthwise direction, if desired.

It is not essential that the internal circuitry of the device, connected to the terminal 3, be an output circuit. It could be an input circuit or any other internal circuit or line whose connection terminal can vary in potential near to a power supply line of the device. Whatever internal circuit or line is connected to the connection terminal should of course not have any NMOS protection transistors connected directly to the connection terminal since these will impose a large and non-linear parasitic capacitance on the connection terminal. The internal circuit may include NMOS transistors connected directly to the connection terminal provided that these are small enough to impose only a small or linear parasitic capacitance on the connection terminal.

Figure 3B:
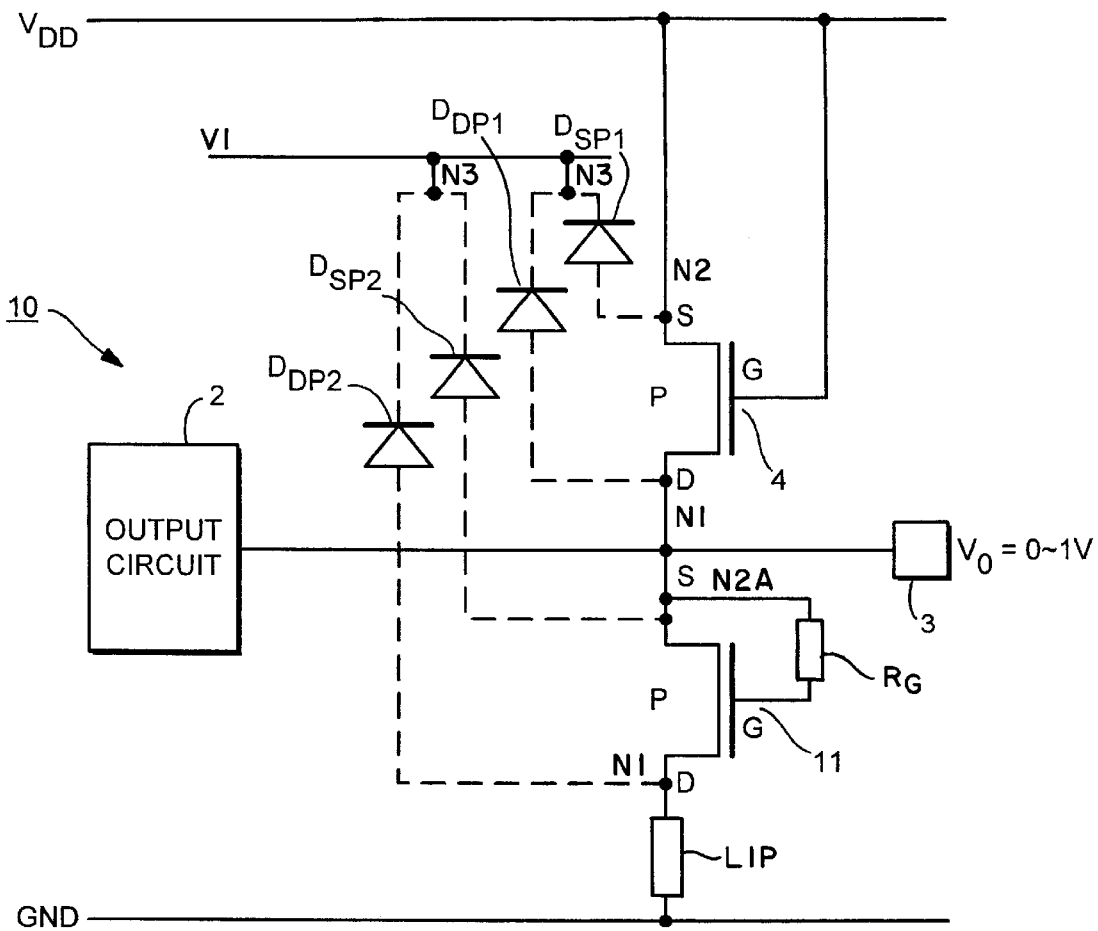
FIG. 3B shows a second circuit diagram of parts of a semiconductor device having P-type ESD protection embodying the present invention.
Figure 3C:
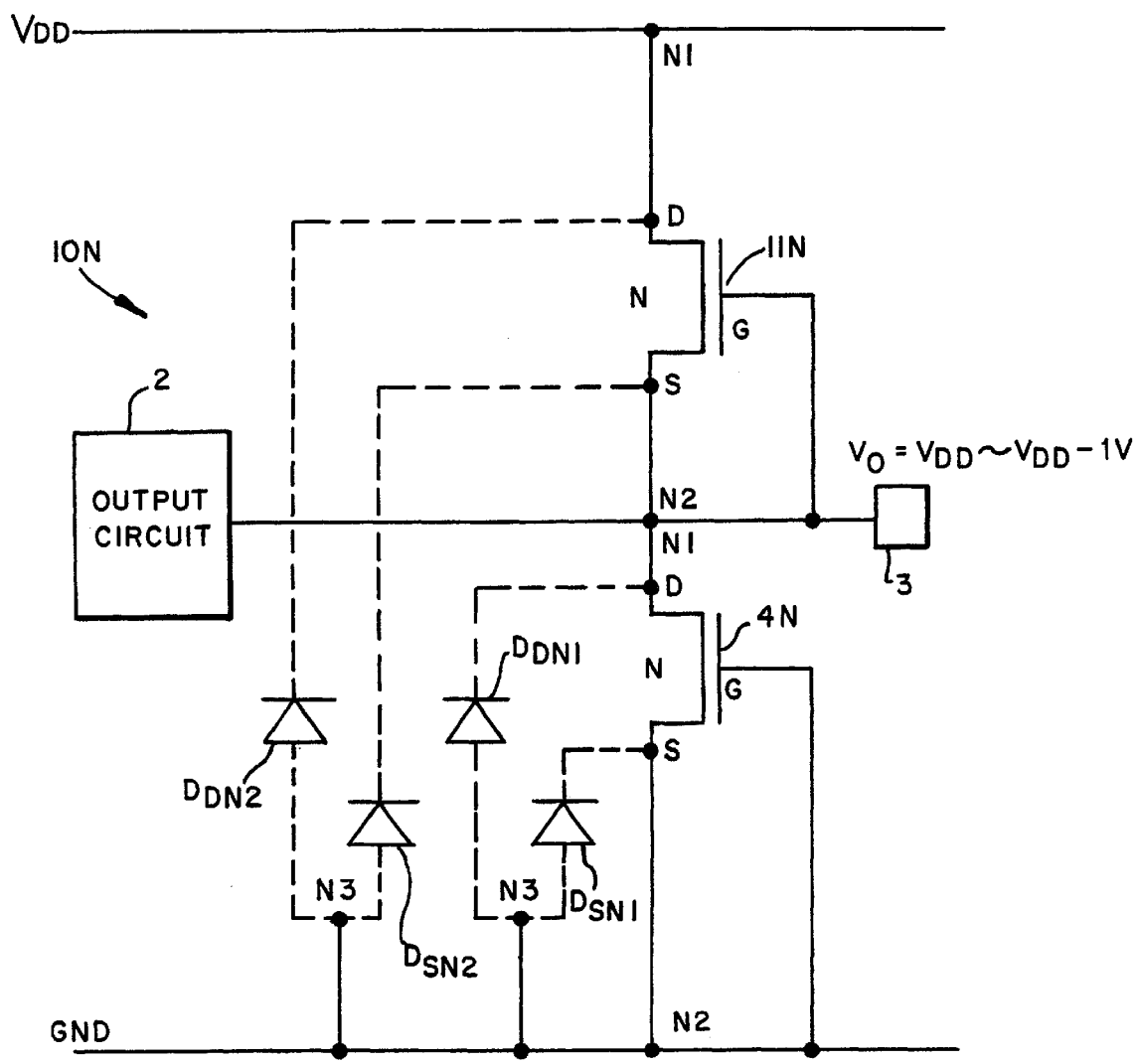
FIG. 3C shows a first circuit diagram of parts of a semiconductor device having N-type ESD protection embodying the present invention.
Figure 3D:
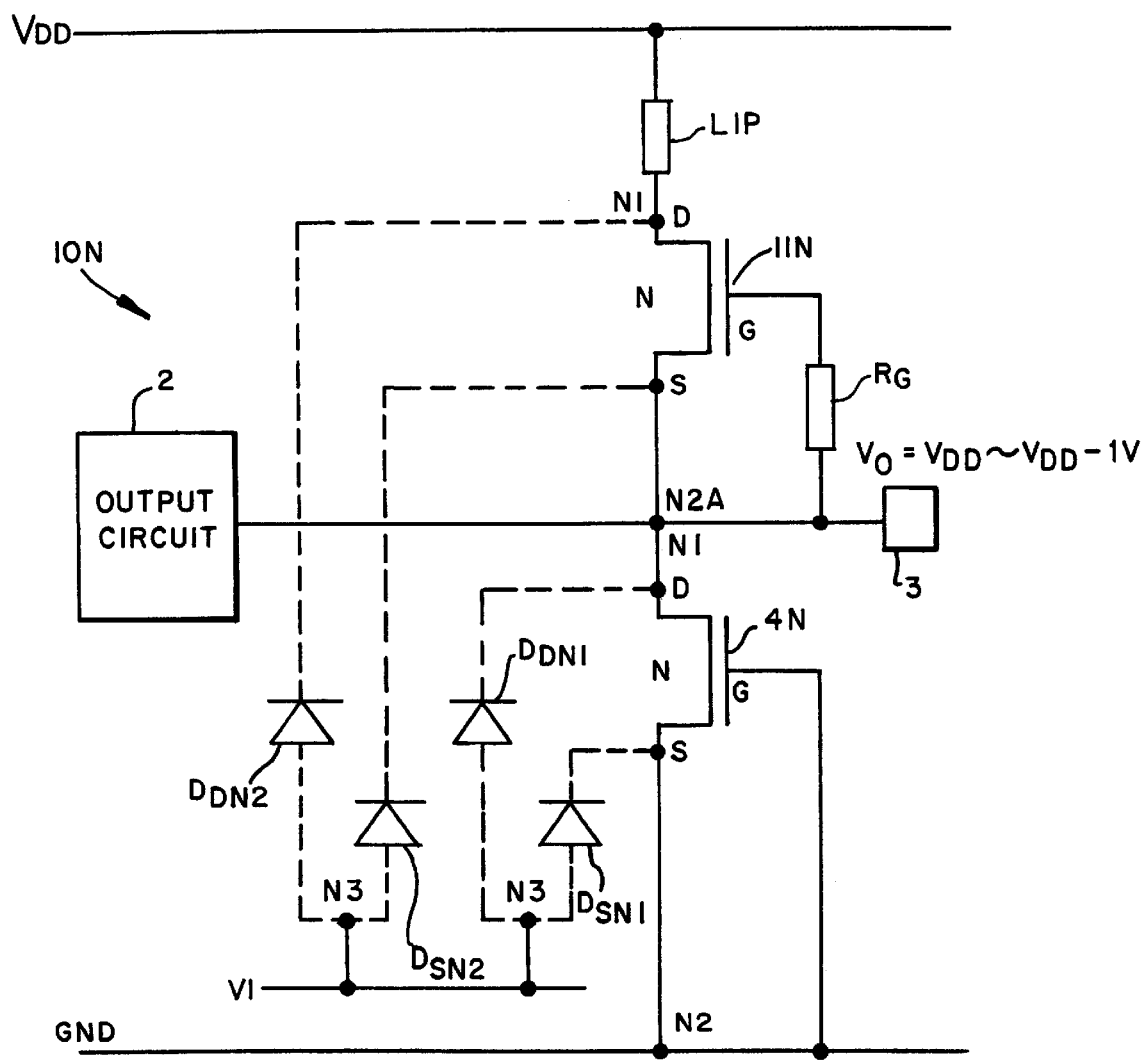
FIG. 3D shows a second circuit diagram of parts of a semiconductor device having N-type ESD protection embodying the present invention.

It is also not essential that the gate of the transistor 11 be connected directly to its source region. A resistor, RG for example, could be connected between the gate and the source region so that the gate potential is equal or close to the source-region potential as illustrated in FIG. 3B. It is generally preferable, however for the gate-source connection to be a direct one.

Similarly, it is not essential for the drain region of the transistor 11 to be connected to the negative supply line GND. The drain region can be connected to any suitable discharge path LIP as shown in FIG. 3B (a low-impedance path is required) having a potential that causes the transistor 11 to turn ON when the output-terminal potential falls below a desired protection potential. It is convenient, however, in practice for the discharge path to be connected directly to the negative supply line GND. The threshold voltage $V_T$ of the PMOS transistor 11 is typically 1 volt, so that when the discharge path is connected to GND, the protection potential which the transistor turns ON is −1V.

It will be appreciated that the regions of semiconductor material surrounding the source and drain regions 17 of the PMOS transistors 11 and 4 in FIG. 3 (e.g. n-wells in the case of a p-type substrate) need not be connected to VDD. These surrounding regions could be set to any other potentials such as for example V1 as shown in FIG. 3B for as P-type device and as shown in FIG. 3D for an N-type device suitable for maintaining the source and drain diodes in a reverse-biased condition when the output-terminal potential varies within its permitted operating range.

Figure 5B:
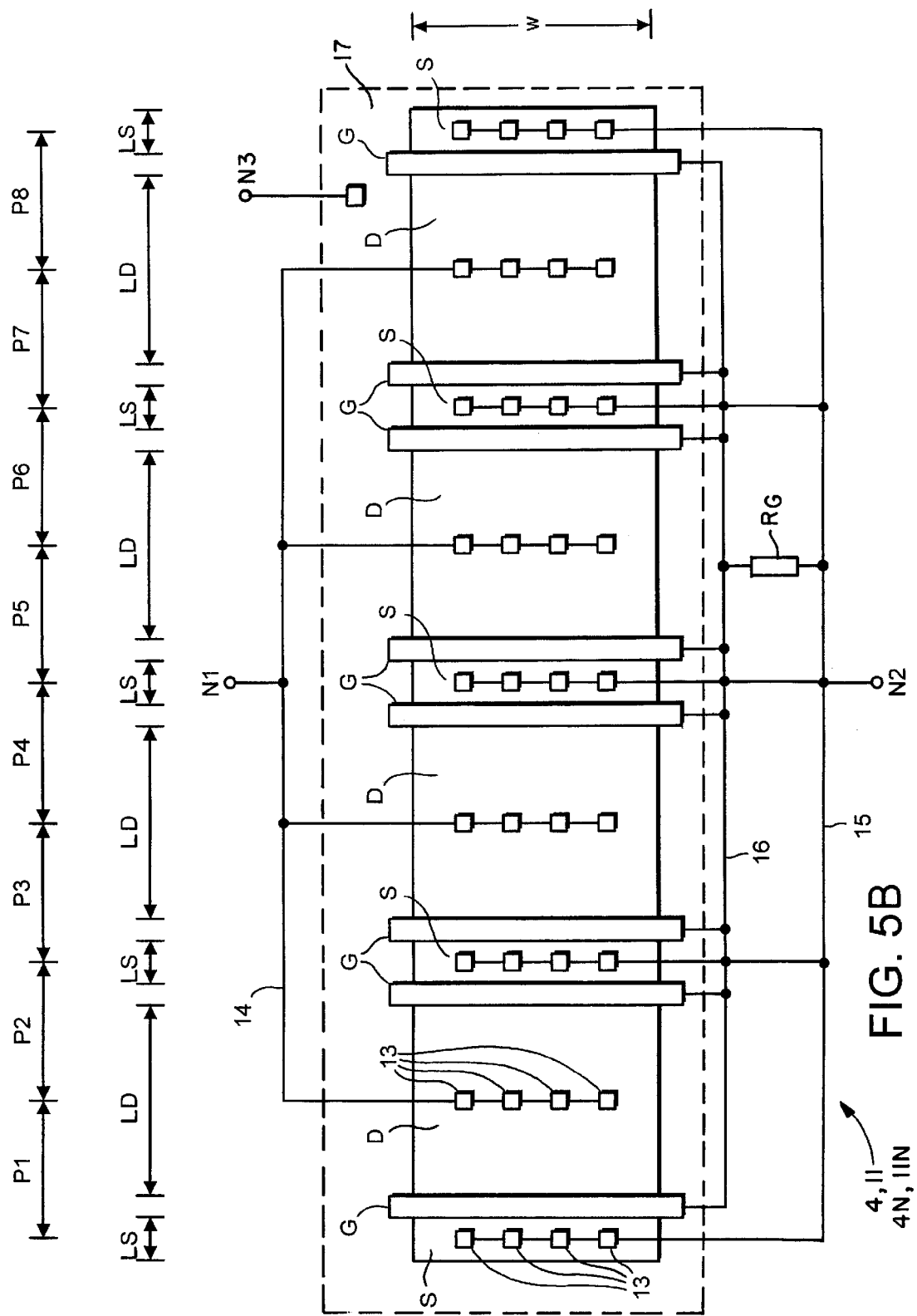
FIG. 5B shows a schematic plan view of a part of the ESD protection circuitry in the FIG. 3B or the FIG. 3D device.

It will also be understood that if the output circuit 2 in FIG. 3 was of the kind which had a permitted range of output voltages close to the positive supply line VDD, instead of to the ground line GND, two NMOS transistors could be used for the ESD protection, the NMOS transistor between the output terminal 3 and GND being connected and arranged in the same way as the NMOS transistor 5 in FIG. 1 and the other NMOS transistor between the output terminal 3 and VDD having its source region and gate connected to the output terminal 3 and its drain region connected to VDD. It will further be appreciated that a circuit configuration of the present invention implemented with N-type transistors is shown in FIGS. 3C and 3D. FIG. 3C is analogous to the embodiment of FIG. 3A and FIG. 3D is analogous to the embodiment of FIG. 3B. In the NMOS embodiment, region 17 as shown in FIGS. 5A and 5B is of a P-type conductivity material and source regions S and drain regions D are of an N-type conductivity material.

What is claimed is:

1. A semiconductor device having electrostatic discharge protection for internal circuitry, the device being connected in use to first and second power supply lines, the first power supply line being positive with respect to the second power supply line, the device comprising:

a connection terminal for connecting the internal circuitry of the device to external circuitry, the connection-terminal potential being permitted to vary, in use of the device, within a predetermined range of potentials including a potential equal or close to the potential of the second power supply line of the device; and electrostatic discharge protection circuitry including a P-type field-effect transistor having a source region connected to said connection terminal, a gate connected so as to be equal or close in potential to said source region, and a drain region connected to a discharge path whose potential is such that the transistor turns ON when the connection-terminal potential falls below a predetermined protection potential, and a region of N-type semiconductor material, surrounding said source region, being maintained at a potential such that a source diode, effectively formed between said source region and said surrounding region of said source region when the device is in use, is reverse-biased by at least a predetermined source diode reverse-bias potential for any value of said connection-terminal potential within said predetermined range, thereby to reduce adverse effects of a parasitic capacitance associated with said source diode for connection-terminal potentials within said predetermined range.

2. A device as claimed in claim 1, wherein said gate is connected directly to said source region.

3. A device as claimed in claim 1, wherein said drain region is connected directly to said second power supply line.

4. A device as claimed in claim 1, wherein a first spacing, between said gate and contacts for said drain region, is greater than a second spacing between said gate and contacts for said source region.

5. A device as claimed in claim 4, wherein the ratio between said first spacing and said second spacing is in the range from 2:1 to 20:1.

6. A device as claimed in claim 5, wherein said ratio is in the range from 5:1 to 10:1.

7. A device as claimed in claim 4, wherein said first spacing is of the order of 0.5 to 1 $\mu$m.

8. A device as claimed in claim 1, wherein said field-effect transistor has an effective width of the order of 1000 $\mu$m or more.

9. A device as claimed in claim 1, wherein the physical width of the transistor is about 100 $\mu$m.

10. A device as claimed in claim 1, wherein said transistor has an interleaved construction having two or more transistor portions arrayed one after the next in a lengthwise direction of the transistor and connected electrically in parallel with one another, two mutually-adjacent transistor portions sharing one set of drain-region contacts or source-region contacts.

11. A device as claimed in claim 10, having ten or more said lengthwise-arranged transistor portions.

12. A device as claimed in claim 1, wherein said surrounding region is maintained at a potential equal or close to the potential of said first power supply line of the device.

13. A device as claimed in claim 12, wherein said surrounding region is connected to said first power supply line of the device.

14. A device as claimed in claim 12, wherein said predetermined source-diode reverse-bias potential is at least 2 volts when a potential difference between said first power supply line and said second power supply line is equal or close to 3 volts.

15. A device as claimed in claim 1, wherein said electrostatic discharge protection circuitry also includes a further P-type field-effect transistor having a drain region connected to said connection terminal, a source region connected to a further discharge path whose potential is such that said further transistor turns ON when the connection terminal potential rises above a further predetermined protection potential, said further transistor also having a gate connected so as to be equal or close in potential to said source region, and a region of N-type semiconductor material, surrounding said drain region of said further transistor, being maintained at a potential such that a drain diode, effectively formed between said drain region of said further transistor and said surrounding region of said drain region of said further transistor when the device is in use, is reverse-biased by at least a predetermined drain-diode reverse-bias potential for any value of said connection-terminal potential within said predetermined range, thereby to reduce a parasitic capacitance associated with that drain diode.

16. A device as claimed in claim 15, wherein said further discharge path is connected directly to said first power supply line of the device.

17. A device as claimed in claim 15, wherein the gate of said further transistor is connected directly to said source region thereof.

18. A device as claimed in claim 15, wherein each of said surrounding region of said source region and said surrounding region of said drain region of said further transistor is maintained at a potential equal or close to the potential of said first power supply line of the device.

19. A device as claimed in claim 18, wherein each of said surrounding region of said source region and said surrounding region of said drain region of said further transistor is connected directly to said first power supply line of the device.

20. A device as claimed in claim 18, wherein each said predetermined reverse-bias potential is at least 2 volts when a potential difference between said first power supply line and said second power supply line is equal or close to 3 volts.

21. A device as claimed in claim 1, wherein a magnitude of said parasitic capacitance and/or a non-linearity in magnitude of said parasitic capacitance as the connection-terminal potential varies is/are reduced by said reverse bias potential.

22. A semiconductor device having electrostatic discharge protection for internal circuitry, the device being connected in use to first and second power supply lines, the first power supply line being positive with respect to the second power supply line, the device comprising:

a connection terminal for connecting the internal circuitry of the device to external circuitry, the connection-terminal potential being permitted to vary, in use of the device, within a predetermined range of potentials including a potential equal or close to the potential of the first power supply line of the device; and electrostatic discharge protection circuitry including an N-type field-effect transistor having a source region connected to said connection terminal, a gate connected so as to be equal or close in potential to said source region, and a drain region connected to a discharge path whose potential is such that the transistor turns ON when the connection-terminal potential falls below a predetermined protection potential, and a region of P-type semiconductor material, surrounding said source region, being maintained at a potential such that a source diode, effectively formed between said source region and said surrounding region of said source region when the device is in use, is reverse-biased by at least a predetermined source diode reverse-bias potential for any value of said connection-terminal potential within said predetermined range, thereby to reduce adverse effects of a parasitic capacitance associated with said source diode for connection-terminal potentials within said predetermined range.

23. A device as claimed in claim 22, wherein said gate is connected directly to said source region.

24. A device as claimed in claim 22, wherein said drain region is connected directly to said first power supply line.

25. A device as claimed in claim 22, wherein a first spacing, between said gate and contacts for said drain region, is greater than a second spacing between said gate and contacts for said source region.

26. A device as claimed in claim 25, wherein the ratio between said first spacing and said second spacing is in the range of 2:1 to 20:1.

27. A device as claimed in claim 26, wherein said ratio is in the range from 5:1 to 10:1.

28. A device as claimed in claim 25, wherein said first spacing is of the order of 0.5 to 1 $\mu$m.

29. A device as claimed in claim 22, wherein said field-effect transistor has an effective width of the order of 1000 $\mu$m or more.

30. A device as claimed in claim 22, wherein the physical width of the transistor is about 100 $\mu$m.

31. A device as claimed in claim 22, wherein said transistor has an interleaved construction having two or more transistor portions arrayed one after the next in a lengthwise direction of the transistor and connected electrically in parallel with one another, two mutually-adjacent transistor portions sharing one set of drain-region contacts or source-region contacts.

32. A device as claimed in claim 22, wherein said surrounding region is maintained at a potential equal or close to the potential of the second power supply line of the device.

33. A device as claimed in claim 32, wherein said surrounding region is connected directly to said second power supply of the device.

34. A device as claimed in claim 32, wherein said predetermined source-diode reverse-bias potential is at least 2 volts when a potential difference between said first power supply line and said second power supply line is equal or close to 3 volts.

35. A device as claimed in claim 22, wherein said electrostatic discharge protection circuitry also includes a further N-type field-effect transistor having a drain region connected to said connection terminal, a source region connected to a further discharge path whose potential is such that said further transistor turns ON when the connection-terminal potential falls below a further predetermined protection potential, said further transistor also having a gate connected so as to be equal or close in potential to said source region, and a region of P-type semiconductor material, surrounding said drain region of said further transistor, being maintained at a potential such that a drain diode, effectively formed between said drain region of said further transistor and said surrounding region of said drain region of said further transistor when the device is in use, is reverse-biased by at least a predetermined drain-diode reverse-bias potential for any value of said connection-terminal potential within said predetermined range, thereby to reduce a parasitic capacitance associated with that drain diode.

36. A device as claimed in claim 35, wherein said further discharge path is connected directly to said second power supply line of the device.

37. A device as claimed in claim 35, wherein the gate of said further transistor is connected directly to said source region thereof.

38. A device as claimed in claim 35, wherein each of said surrounding region of said source region and said surrounding region of said drain region of said further transistor is maintained at a potential equal or close to the potential of said second power supply line of the device.

39. A device as claimed in claim 35, wherein each of said surrounding region of said source region and said surrounding region of said drain region of said further transistor is connected directly to said second power supply line of the device.

40. A device as claimed in claim 39, wherein each said predetermined reverse-bias potential is at least 2 volts when a potential difference between said first power supply line and said second power supply line is equal or close to 3 volts.

41. A device as claimed in claim 22, wherein a magnitude of said parasitic capacitance and/or a non-linearity in magnitude of said parasitic capacitance as the connection-terminal potential varies is/are reduced by said reverse bias potential.

42. A semiconductor device having electrostatic discharge protection for output circuitry internal to the device, the device being connected in use to first and second power supply lines, the first power supply line being positive with respect to the second power supply line, the device comprising:

an output terminal for connecting the output circuitry of the device to external circuitry, the output-terminal potential being permitted to vary, in use of the device, within a predetermined range of potentials including a potential equal or close to the potential of the second power supply line of the device; and electrostatic discharge protection circuitry including a P-type field-effect transistor having a source region connected to said output terminal, a gate connected so as to be equal or close in potential to said source region, and a drain region connected to a discharge path whose potential is such that the transistor turns ON when the output-terminal potential falls below a predetermined protection potential and a region of N-type semiconductor material, surrounding said source region, being maintained at a potential such that a source diode, effectively formed between said source region and said surrounding region when the device is in use, is reverse-biased by at least a predetermined source-diode reverse bias potential for any value of said output-terminal potential within said predetermined range, thereby to reduce adverse effects of a parasitic capacitance associated with said source diode for output-terminal potentials within said predetermined range.

43. A semiconductor device having electrostatic discharge protection for output circuitry internal to the device, the device being connected in use to first and second power supply lines, the first power supply line being positive with respect to the second power supply line, the device comprising:

an output terminal for connecting the output circuitry of the device to external circuitry, the output-terminal potential being permitted to vary, in use of the device, within a predetermined range of potentials including a potential equal or close to the potential of the first power supply line of the device; and electrostatic discharge protection circuitry including a N-type field-effect transistor having a source region connected to said output terminal, a gate connected so as to be equal or close in potential to said source region, and a drain region connected to a discharge path whose potential is such that the transistor turns ON when the output-terminal potential falls below a predetermined protection potential and a region of P-type semiconductor material, surrounding said source region, being maintained at a potential such that a source diode, effectively formed between said source region and said surrounding region when the device is in use, is reverse-biased by at least a predetermined source-diode reverse bias potential for any value of said output-terminal potential within said predetermined range, thereby to reduce adverse effects of a parasitic capacitance associated with said source diode for output-terminal potentials within said predetermined range.

44. A method of reducing adverse effects of parasitic capacitance in a semiconductor device having electrostatic discharge protection for internal circuitry, the device being connected in use to first and second power supply lines, the first power supply line being positive with respect to the second power supply line, and the device comprising:

a connection-terminal for connecting the internal circuitry of the device to external circuitry, the connection-terminal potential being permitted to vary, in use of the device, within a predetermined range of potentials including a potential equal or close to the potential of the second power supply line of the device; and electrostatic discharge protection circuitry including a P-type field-effect transistor having a source region connected to said connection terminal, a gate connected so as to be equal or close in potential to said source region, and a drain region connected to a discharge path whose potential is such that the transistor turns ON when the connection-terminal potential falls below a predetermined protection potential;

the method comprising:

maintaining a region of N-type semiconductor material, surrounding said source region, at a potential such that a source diode, effectively formed between said source region and said surrounding region when the device is in use, is reverse-biased by at least a predetermined source-diode reverse bias potential for any value of said connection-terminal potential within said predetermined range, thereby to reduce a non-linearity and/or a magnitude of a parasitic capacitance associated with said source diode for connection-terminal potentials within said predetermined range.

45. A method of reducing adverse effects of parasitic capacitance in a semiconductor device having electrostatic discharge protection for internal circuitry, the device being connected in use to first and second power supply lines, the first power supply line being positive with respect to the second power supply line, and the device comprising:

a connection-terminal for connecting the internal circuitry of the device to external circuitry, the connection-terminal potential being permitted to vary, in use of the device, within a predetermined range of potentials including a potential equal or close to the potential of the first power supply line of the device; and electrostatic discharge protection circuitry including a N-type field-effect transistor having a source region connected to said connection terminal, a gate connected so as to be equal or close in potential to said source region, and a drain region connected to a discharge path whose potential is such that the transistor turns ON when the connection-terminal potential falls below a predetermined protection potential;

the method comprising:

maintaining a region of P-type semiconductor material, surrounding said source region, at a potential such that a source diode, effectively formed between said source region and said surrounding region when the device is in use, is reverse-biased by at least a predetermined source-diode reverse bias potential for any value of said connection-terminal potential within said predetermined range, thereby to reduce a non-linearity and/or a magnitude of a parasitic capacitance associated with said source diode for connection-terminal potentials within said predetermined range.

* * * * *